(12) United States Patent
Chabinyc et al.

(10) Patent No.: US 7,838,933 B2
(45) Date of Patent: Nov. 23, 2010

(54) PRINTING METHOD FOR HIGH PERFORMANCE ELECTRONIC DEVICES

(76) Inventors: Michael L. Chabinyc, 1685 Noe St., San Francisco, CA (US) 94131; William S. Wong, 131 Fleetwood Dr., San Carlos, CA (US) 94070

(*) Notice: Subject to any disclaimer, the term of this patent is extended or adjusted under 35 U.S.C. 154(b) by 381 days.

(21) Appl. No.: 11/644,055

(22) Filed: Dec. 22, 2006

(65) Prior Publication Data
US 2008/0149920 A1  Jun. 26, 2008

(51) Int. Cl.
*H01L 27/12* (2006.01)
(52) U.S. Cl. ............... 257/347; 257/401; 257/E29.051; 977/723; 977/786
(58) Field of Classification Search .............. 438/584; 977/721, 723, 730, 762, 778, 786, 787; 257/347, 257/401, E29.051
See application file for complete search history.

(56) References Cited

U.S. PATENT DOCUMENTS

| | | | |
|---|---|---|---|
| 6,872,645 | B2 | 3/2005 | Duan et al. |
| 7,064,372 | B2 | 6/2006 | Duan et al. |
| 7,135,728 | B2 | 11/2006 | Duan et al. |
| 7,233,041 | B2 | 6/2007 | Duan et al. |
| 7,262,501 | B2 | 8/2007 | Duan et al. |
| 7,264,325 | B2 * | 9/2007 | Kawatoko et al. ............ 347/15 |
| 7,405,129 | B2 * | 7/2008 | Afzali-Ardakani et al. .. 438/289 |
| 2004/0005723 | A1 | 1/2004 | Empedocles et al. |
| 2005/0079659 | A1 | 4/2005 | Duan et al. |
| 2006/0110847 | A1 * | 5/2006 | Fujimori et al. ............... 438/99 |
| 2008/0009434 | A1 | 1/2008 | Reches et al. |
| 2008/0038520 | A1 | 2/2008 | Pan et al. |
| 2009/0061190 | A1 | 3/2009 | Gazit et al. |
| 2009/0291433 | A1 | 11/2009 | Pollack et al. |

OTHER PUBLICATIONS

Robin S. Friedman, et al: High-Speed Integrated Nanowire Circuits, Nature, vol. 434, Apr. 28, 2005, p. 1085, www.nature.com/nature.
Xiangfeng Duan, et al.: High-Performance Thin-Film Transistors Using Semiconductor Nanowires and Nanoribbons, Nature, vol. 425, Sep. 18, 2003, pp. 274-278, www.nature.com/nature.
Yu Huang, et al.: Directed Assembly of One-Dimensional Nanostructures into Functional Networks, Science Magazine vol. 291, Jan. 26, 2001, pp. 630-633 www.sciencemag.org.
Friedman, Robin S., et al., "High-Speed Integrated Nanowire Circuits", Nature, vol. 434, Apr. 28, 2005, p. 1085, www.nature.com/nature.

(Continued)

*Primary Examiner*—Minh-Loan T Tran
(74) *Attorney, Agent, or Firm*—Blakely Sokoloff Taylor & Zafman

(57) ABSTRACT

A method of depositing elongated nanostructures that allows accurate positioning and orientation is described. The method involves printing or otherwise depositing elongated nanostructures in a carrier solution. The deposited droplets are also elongated, usually by patterning the surface upon which the droplets are deposited. As the droplet evaporates, the fluid flow within the droplets is controlled such that the nanostructures are deposited either at the edge of the elongated droplet or the center of the elongated droplet. The described deposition technique has particular application in forming the active region of a transistor.

14 Claims, 11 Drawing Sheets

OTHER PUBLICATIONS

Duan, Xiangfeng, et al., "High-Performance Thin-Film Transistors Using Semiconductor Nanowires and Nanoribbons", Nature, vol. 425, Sep. 18, 2003, p. 274-278, www.nature.com/nature.

Huang, Yu, et al., "Directed Assembly of One-Dimensional Nanostructures into Functional Networks", Science Magazine, vol. 291, Jan. 26, 2001, p. 630-633, www.sciencemag.org.

Leopoldes, J., et al., "Jetting Micron-Scale Droplets onto Chemically Heterogeneous Surfaces", 2003, American Chemical Societ, Sep. 2, 2003, pp. 9,818-9,822.

Deegan, R., et al., "Capillary Flow as the Cause of Ring Stains from Dried Liquid Drops", Nature, Oct. 23, 1997, vol. 389, pp. 827-829.

De Gans, B. et al., "Inkjet Printing of Well-Defined Polymer Dots and Arrays", American Chemical Society, Jun. 9, 2004, pp. A-E.

J. Leopoldes, A. Dupuis, D G. Bcknall, and J. M. Yeomans: Jetting Micron-Scale Droplets onto Chemically Heterogeneous Surfaces, 2003 American Chemical Society, Sep. 2, 2003, pp. 9,818-9,822.

R. Deegan, O. Bakajin, T. Dupont, G. Huber, S. Nagel and T. Witten: Capillary Flow As the Cause of Ring Stains From Dried Liquid Drops, Nature, Oct. 23, 1997, vol. 389, pp. 827-829.

B. De Gans and U. Schubert: Inkjet Printing of Well-Defined Polymer Dots and Arrays, American Chemical Society, Jun. 9, 2004, pp. A-E.

\* cited by examiner

PRINTING METHOD FOR HIGH PERFORMANCE ELECTRONIC DEVICES

CROSS-REFERENCE TO RELATED APPLICATIONS

The current application is related to U.S. patent application Ser. No. 11/644,070, filed Dec. 22, 2006, entitled "Method For Aligning Elongated Nanostructures" which was filed on the same day and is hereby incorporated by reference.

BACKGROUND

Elongated nanostructures such as nanocrystals, nanotubes and nanowires have become increasingly important due to their interesting electrical and optical characteristics. Nanostructures comprise both inorganic materials, such as silicon, germanium, and gallium nitride, and organic materials, such as carbon nanotubes and semiconducting polymers. In particular, single-crystal nanowires and carbon nanotubes have proven useful for high-mobility transistors on a variety of substrates.

Typically, these devices are made by spin-coating liquids containing elongated nanostructures onto a substrate. Electron-beam lithography may be used to pattern the circuits using standard methods and thereby remove elongated nanostructures from select regions. The remaining elongated nanostructures typically have random orientation which may be undesirable for some applications.

In order to control orientation, U.S. Pat. No. 6,872,645 entitled Methods of Positioning and/or Orienting Nanostructures by Duan et al. describes using microfluidic channels to control nanowire orientation. Although the microfluidic channels achieve some level of patterning, it has been difficult experimentally to achieve arbitrary patterns with good registration of the nanowires. Furthermore, building three dimensional microfluidic systems substantially increases the complexity of device fabrication.

Another disadvantage of current deposition systems is that substantial nanostructure material is wasted. Both spin coating and microfluidic channels use substantially more nanostructure material than is incorporated into the final device, especially when areas that need nanostructures are highly localized. Nanostructure material is expensive. Substantial wasted nanostructure material makes the cost of forming large area devices, such as displays, using the described techniques prohibitively expensive.

Thus an improved method of depositing and orienting elongated nanostructures is needed.

SUMMARY

An improved method for forming a transistor is described. In the method, a dielectric substrate is formed, the dielectric substrate having a first surface that includes a fluid accumulation region between an area for a source electrode and an area for a drain electrode. A droplet of fluid is deposited on the dielectric substrate, the droplet including semiconductor nanowires suspended in a carrier fluid. The droplet is elongated such that upon evaporation of the carrier fluid, the nanowires are aligned to form the active region of the transistor between the area for a source electrode and the area for a drain electrode.

BRIEF DESCRIPTION OF THE DRAWINGS

FIG. 18 shows the contact angle that results from one example of an expanding droplet.

DETAILED DESCRIPTION

A method of depositing, positioning and orienting elongated nanostructures is described. As used herein, "elongated nanostructures" is broadly defined to mean nanostructures (structures with a smallest dimension below 100 nanometers) that have a length substantially greater than a width. Typically, the length of an elongated nanostructure is at least five times the width. Examples of elongated nanostructures include, but are not limited to, nanowires, nanotubes and nanocrystals. The method involves printing droplets of a fluid that includes the nanostructures. The droplet position and shape are controlled to define the location and orientation of the deposited nanostructures.

Figure 1:
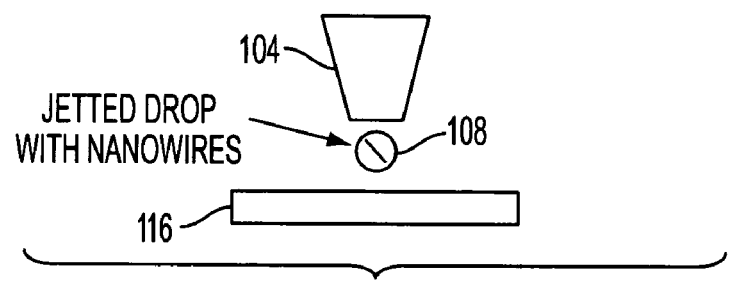
FIG. 1 shows a printhead ejecting a fluid droplet including elongated nanostructures.

FIG. 1 shows a printhead 104 ejecting a fluid droplet 108 including an elongated nanostructure 112 onto a substrate 116. Fluid droplet 108 is a droplet of printable fluid solution that includes a stable suspension of nanostructures in a carrier fluid. The printable fluid should have lower viscosities to avoid printhead clogging. Examples of carrier solutions include, but are not limited to, water, organic solvents and hot-melt wax. Chemical methods may also be used to prevent nanostructures aggregation. One method of preventing aggregation is to derivative the elongated nanostructure surface with reactive chemicals such as organotrichlorosilanes, or organothiols that chemically bond to the nanostructure. Alternately, added chemicals such as surfactants or organic polymers, may non-covalently attach to the nanostructure surface preventing nanostructure aggregation.

The nanostructure concentration in a droplet varies according to the nanostructure concentration to be deposited in a unit area. An example droplet size may be approximately 100 pL (pico-liters), thus if 100 silicon nanowires were deposited in an area covered by a droplet, the solution concentration would be 100 nanowires per 100 pL of solvent. Assuming 10 nm diameter nanowires that are approximately 2 microns long, the approximate mass concentration might be 1-10 parts per million.

Various technologies may be used to eject droplet 108. In one embodiment, printhead 104 is an inkjet print head that uses piezoelectrics to controllably eject droplet 108. Acoustic nozzleless printheads are especially useful when depositing nanostructures with a length that exceeds 2 microns. The lack of a nozzle avoids the problem of nozzle clogging. Jet printing techniques enable precise alignment of droplets with already fabricated features. However, it should be understood that other printing techniques such as flexographic printing and grauvre printing may also be used.

Figure 2:
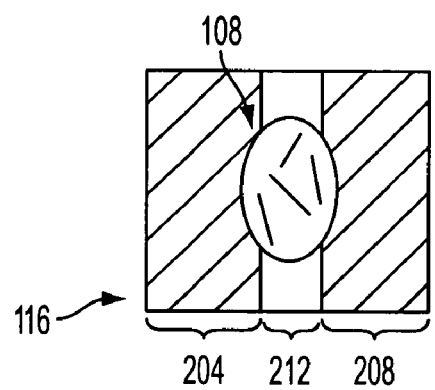
FIG. 2 shows an elongated droplet including elongated nanostructures on a patterned substrate after printed deposition.

Elongated structure orientation or "directionality" may be controlled by controlling the droplet shape after deposition. FIG. 2 shows a top view of droplet 108 after deposition on substrate 116. Substrate 116 has been treated to create a "fluid accumulation region" that causes droplet elongation. In one embodiment, the fluid accumulation region has been prepatterned via changing surface energies or changing topographies to cause droplet 108 elongation. In the illustrated embodiment, substrate 116 has been treated to produce hydrophobic regions 204, 208. Region 212, the fluid accumulation region, may be hydrophilic or simply less hydrophobic then regions 204, 208. Thus droplet 108 elongates to minimize contact with the hydrophobic regions. In an alternate embodiment, surface height variations of substrate 116 may be used to induce droplet elongation. For example, regions 204, 208 may be fabricated slightly elevated compared to fluid accumulation region 212 creating a "trench" in region 212. Capillary forces elongate droplet 108 as it spreads between the walls of the trench.

Figure 3:
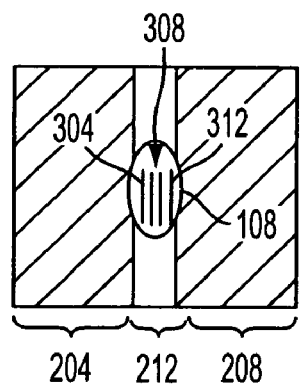
FIG. 3 shows an evaporating elongated droplet aligning elongated nanostructures at the droplet center.

As the carrier solution evaporates, surface tension keeps the nanostructures within droplet 108. Thus, as the elongated droplet slowly decreases in size, the elongated nanostructures gradually align to the shape of the elongated droplet. FIG. 3 shows the gradual alignment of the aligned nanoparticles 304, 308, 312 in the decreased shrinking droplet 108. The elongated nanostructures eventually precipitate from the fluid in an aligned state.

Figure 4:
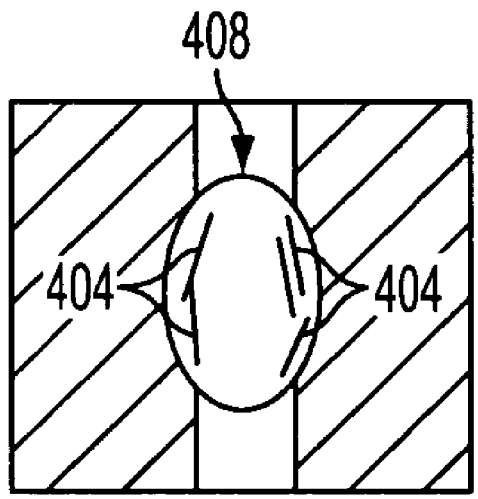
FIG. 4 shows an elongated droplet including elongated nanostructures on a patterned substrate where the nanostructures agglomerate near the droplet edge.
Figure 5:
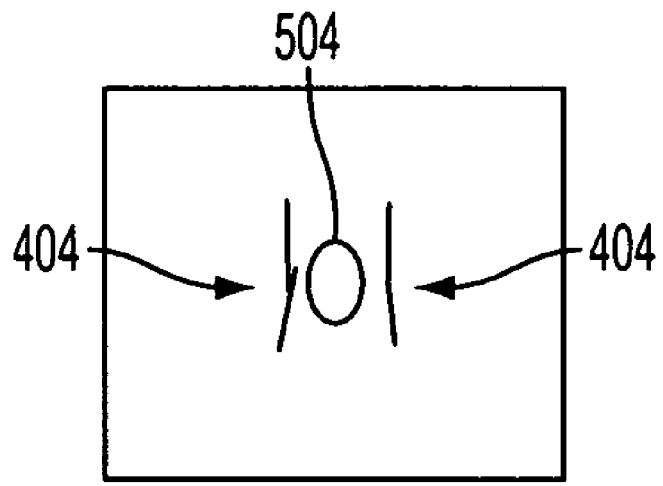
FIG. 5 shows the deposition of elongated nanostructures which agglomerated near the droplet edge.
Figure 6:
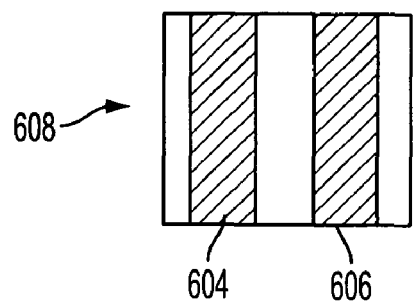
FIG. 6-12 show the fabrication of a transistor by printing nanowires in a carrier solution.

It is noted that the precipitation from the fluid is carefully controlled. In an alternate embodiment, a "coffee stain" or "edge deposition" effect can also be achieved. This effect is shown in FIGS. 4-6. In FIGS. 4-6, the lower density wires are transported to the long side of the droplet by mass flow in the drop due to evaporation as shown in FIG. 4. The long side of elongated nanostructure 404 tends to align along the long side of the droplet maximizing surface contact with droplet perimeter 408. Higher frequency vibrations may be used to move the elongated nanostructures to align as desired.

FIG. 5 shows the resulting structure after evaporation. As the droplet 504 evaporates, the elongated nanostructures 404 fall out of solution early leaving them oriented along the original droplet perimeter. Thus as the droplet shrinks, the remaining droplet 504 contains only carrier solution.

Figure 18:
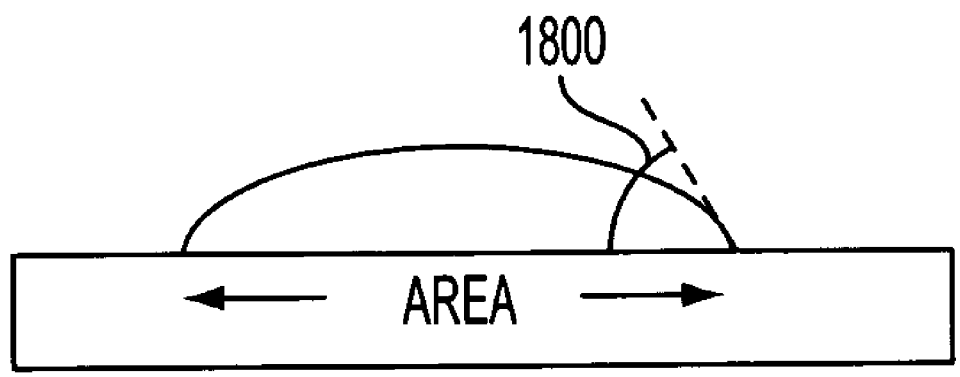
Figure 19:
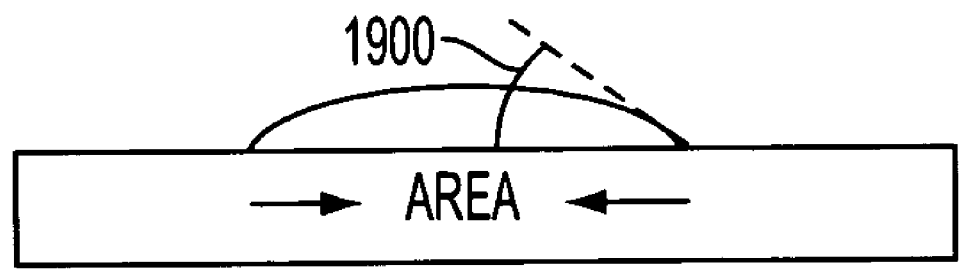
FIG. 19 shows the contact angle that results from one example of a contracting droplet.

The chemistry for selecting between the "edge deposition" effect and the deposition of nanostructures at the droplet center is shown in FIGS. 18-25. Typically, the "edge deposition" effect shown in FIG. 20-22 occurs when a single solvent is used. The solvent is selected such that the droplet edge is pinned to a position on the substrate. Droplet pinning typically occurs for a fluid that has significant contact angle hysteresis as illustrated in FIGS. 18 and 19.

FIG. 18 shows the advancing contact angle 1800 when droplet 1804 is expanding. FIG. 19 shows the receding contact angle 1900 when droplet 1804 is receding. The difference between the receding contact angle and the advancing contact angle is the contact angle hysteresis. A free contact line where the elongated nanostructures move to the droplet center during droplet evaporation typically occurs when the receding contact angle and the advancing contact angle are similar, typically differing by less than 10 degrees.

Figure 20:
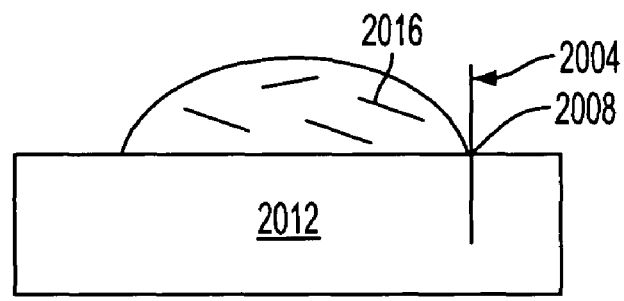
FIGS. 20-22 show evaporation of a droplet with a small contact angle hysteresis that results in deposition of suspended nanoparticles at the droplet center.
Figure 21:
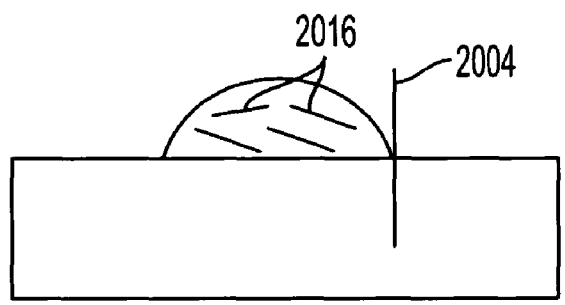
Figure 22:
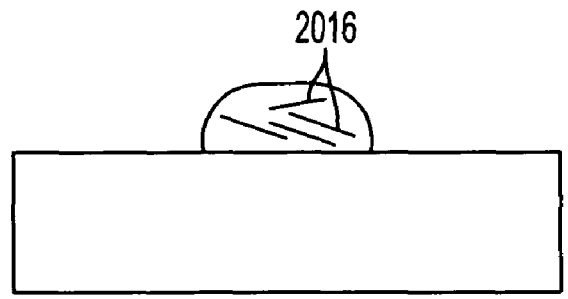

FIGS. 20-22 show the effect of moving an evaporating droplet 2000 that has a free contact line. FIG. 20 shows the droplet upon initial deposition. As the droplet contracts, the droplet retains an approximately similar overall shape and the contact line 2004, defined as the point at which the droplet perimeter edge 2008 contacts the underlying substrate 2012 also moves inward as the droplet evaporates. FIG. 21 illustrates the contact line 2004 inward movement as the droplet evaporates. Surface tension pushes nanoparticles 2016 suspended in the droplet toward the droplet center until in FIG. 22, the amount of carrier fluid no longer suspends the nanoparticles and the nanoparticles fall out of solution.

Figure 23:
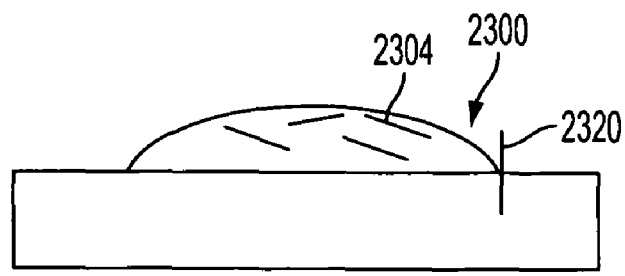
FIGS. 23-25 show evaporation of a pinned droplet with a small receding contact angle that results in edge deposition of suspended nanoparticles.
Figure 24:
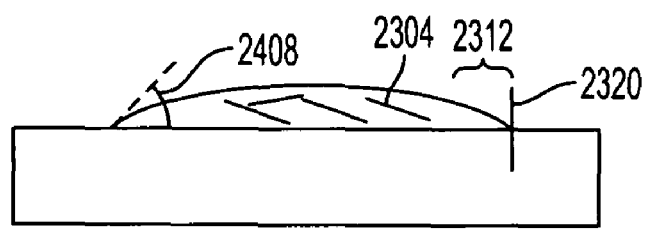
Figure 25:
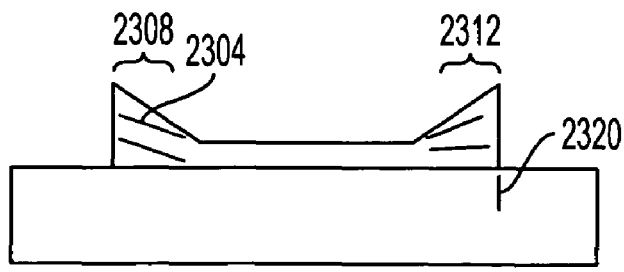

FIG. 23-25 shows an example case in which the nanoparticles are deposited near the droplet perimeter creating an "edge deposition" effect. Droplet pinning produces the edge deposition effect. FIG. 23 shows the droplet 2300 upon initial deposition, FIG. 24 shows droplet 2300 at a later stage in evaporation and FIG. 25 shows the droplet near a final stage where nanoparticles 2304 suspended in droplet 2300 that have accumulated near the droplet outer edge 2308 fall out of solution.

Droplet pinning that produces the "edge deposition" effect typically occurs when the receding contact angle 2408 is small, typically approaching zero degrees. This is most common in solutions that exhibit a large contact angle hysteresis, typically exceeding 10 degrees. In pinning solutions, regions of high curvature undergo much higher evaporation rates then other droplet regions. During pinning, the contact line 2320 where the edge of the droplet meets the substrate stays approximately fixed. The pinned droplet 2300 thus becomes fairly flat with the region of high curvature and thus the high evaporation rates occurring near droplet edge 2312. High edge evaporation rates produces bulk fluid flow towards the droplet edge. The bulk fluid flow carries particles such as colloids, or nanoparticles 2304 to the droplet edge where the colloids or nanoparticles fall out of solution. Such an effect is described in an article entitled "Capillary flow as the cause of ring stains from dried liquid drops" by Deegan et al. Nature, Oct. 23, 1997, pp827 to 829 which is hereby incorporated by reference.

Figure 26:
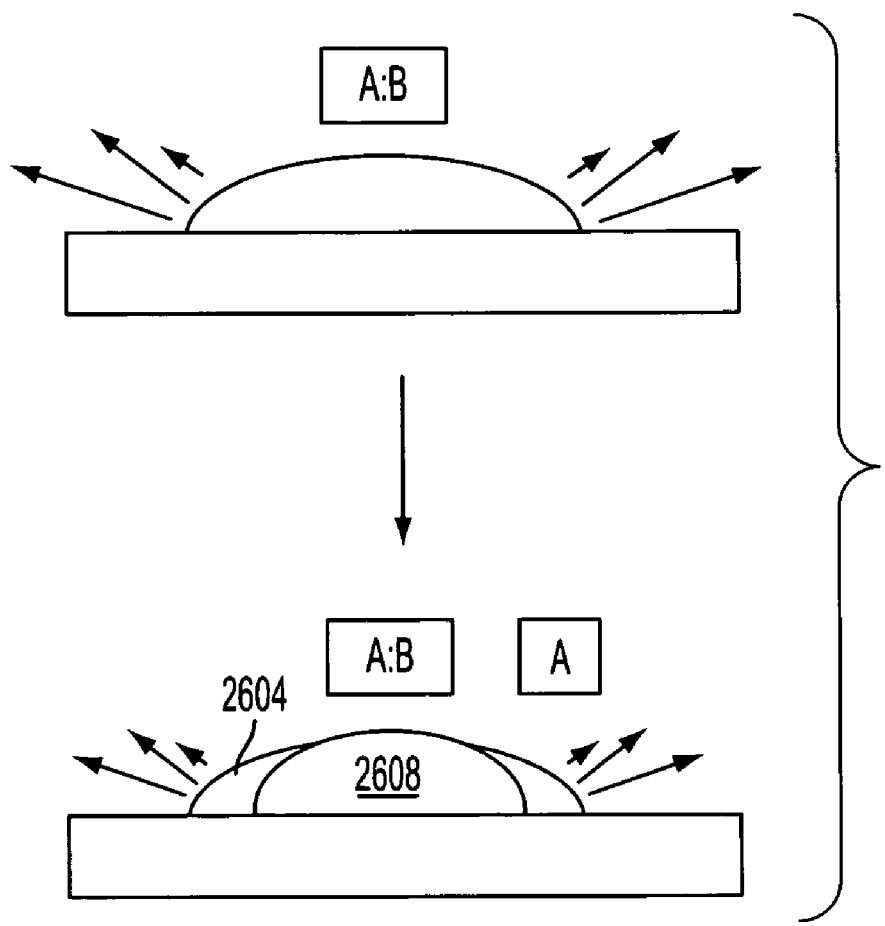
FIG. 26 shows combining two carrier fluids to induce a Marangoni effect.

One method of avoiding pinning and assuring that elongated nanoparticles are deposited in the center of the droplet is to take advantage of Marangoni flows. If a printing fluid comprises two solvents with different vapor pressures and different surface tensions, during evaporation the mass flow in the drop will be complex. FIG. 26 shows combining two carrier fluids to achieve a Marangoni flow. If first fluid 2604 with the highest vapor pressure, that is the fastest to evaporate, also has the highest surface energy, then the second fluid will flow to the edge of the drop and some of the first fluid will flow back towards the center of the drop. Examples of pairs of fluids include water and ethylene glycol or ethylacetate and acetophenone. Such a flow profile will prevent suspended nanostructures from being deposited at the edge of the drying drop as they will follow the mass flows of the fluids. Thus the two fluid mixture will maintain a more homogeneous distribution of nanostructures during drying.

Figure 7:
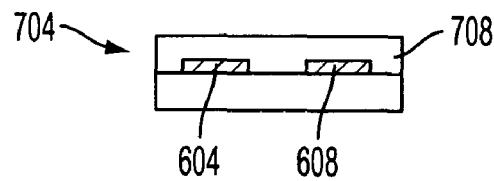

The methods of orienting and depositing elongated nanostructures may be used to form various devices. FIGS. 6-12 show using the "edge deposition" effect to print semiconductor nanowires used to form a transistor active region. FIG. 6 shows a top view and FIG. 7 shows a side view of gate lines 604, 606 deposited over a substrate 608. Gate lines are typically made of a conducting material such as a metal deposited over a nonconducting substrate. A dielectric material 704 is deposited over the gate lines. The dielectric material over the gate lines may be patterned to elongate a droplet positioned in a region between gate lines. Thus in one embodiment, top surface 708 is treated such that regions directly over the gate lines are hydrophobic relative to other surface 708 regions. In an alternate embodiment, top surface 708 regions directly over the gate lines are slightly elevated compared to regions between gate lines.

Figure 8:
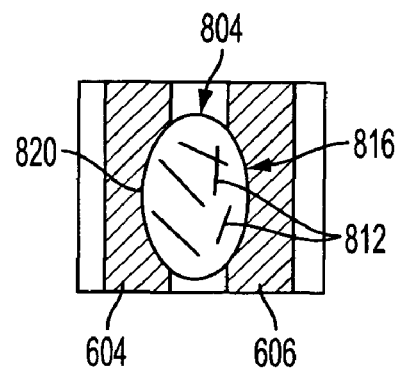
Figure 9:

A printer ejection mechanism such as that shown in FIG. 1 ejects a droplet of solution containing semiconductor nanowires into the area between the two gate lines 604. FIG. 8 shows a top view of the resulting structure and FIG. 9 shows a side view. In FIGS. 8 and 9, droplet 804 center approximately aligns to the middle region 808 between gate lines 604, 606. Droplet 804 is positioned such that the droplet outer edge is approximately in the center of gate lines 604, 606 as shown. Surface treatments of dielectric top surface 708 elongates droplet 804. Initially, the nanowires 812 are somewhat randomly distributed through the droplet. With some agitation of the droplet, the nanowires gradually accumulate near the long edges 816, 820 of the droplet.

Figure 10:
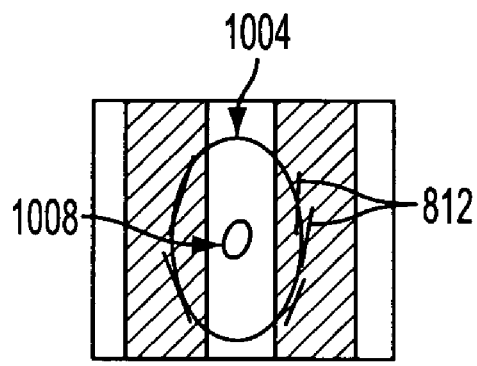
Figure 11:
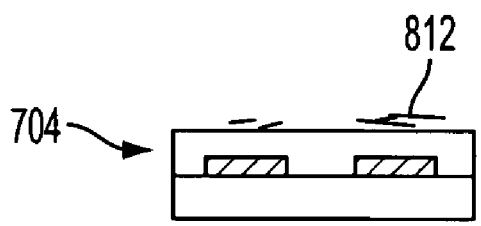

FIG. 10 shows a top view and FIG. 11 shows a side view of nanowires 812 deposited using the "edge deposition" effect. Outline 1004 shows the approximate original outer perimeter of droplet 804 and outline 1008 shows the droplet perimeter at a later point in time after a substantial portion of the droplet has evaporated. Once droplet 804 is reduced to outline 1008, no nanostructures remain in the droplet.

Figure 12:
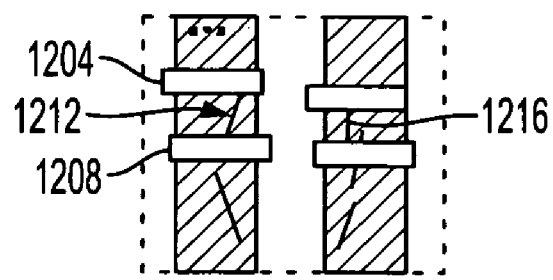

In the illustrated embodiment, the semiconductor nanowires form a transistor active region between a source and a drain electrode. Known processing techniques including wax resist printing may be used to form the source and drain electrode. FIG. 12 shows a source 1204 and a drain 1208 electrode interconnected by an active region that includes semiconductor nanowires 1212 and 1216. A voltage on a gate electrode underneath the nanowires controls current flow between the source and drain.

Figure 13:
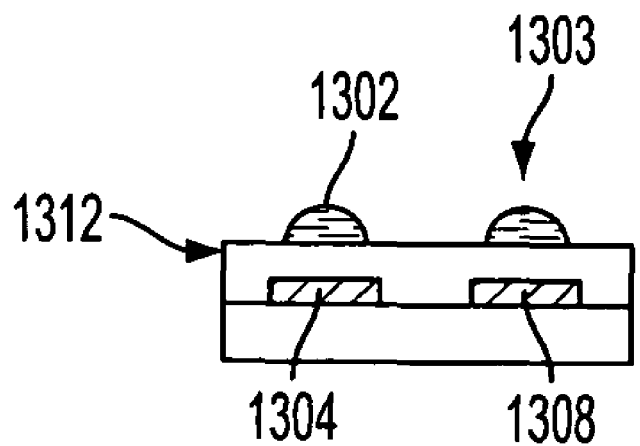
FIG. 13-14 show a variation of the method used in FIG. 6-12 where the droplets agglomerate near the center of the transistor.
Figure 14:
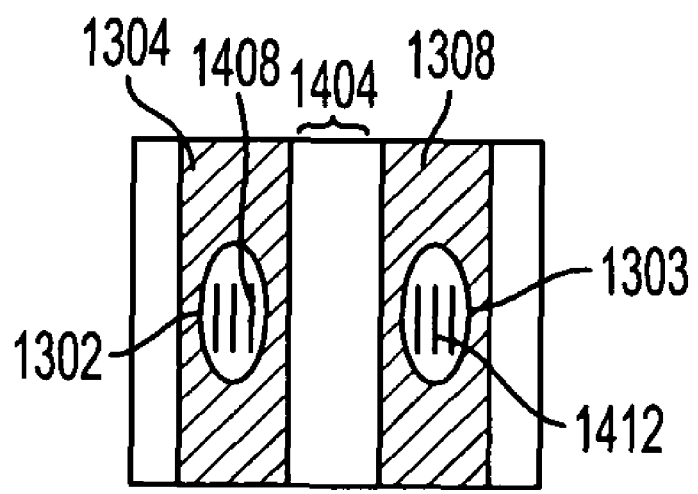

Although the structures of FIGS. 6-12 were formed using an "edge deposition" effect, the same structures may be formed using a carrier that deposits the nanowires at approximately the droplet center as shown in FIGS. 13-14. FIG. 13 shows a side view and FIG. 14 shows a top view of a droplet deposited in the center of gate lines 1304, 1308. In FIG. 14, hydrophobic regions 1404 is the area of dielectric 1312 top surface positioned between adjacent gate lines. The hydrophobicity results in elongated droplets positioned over gate lines 1304, 1308.

Figure 15:
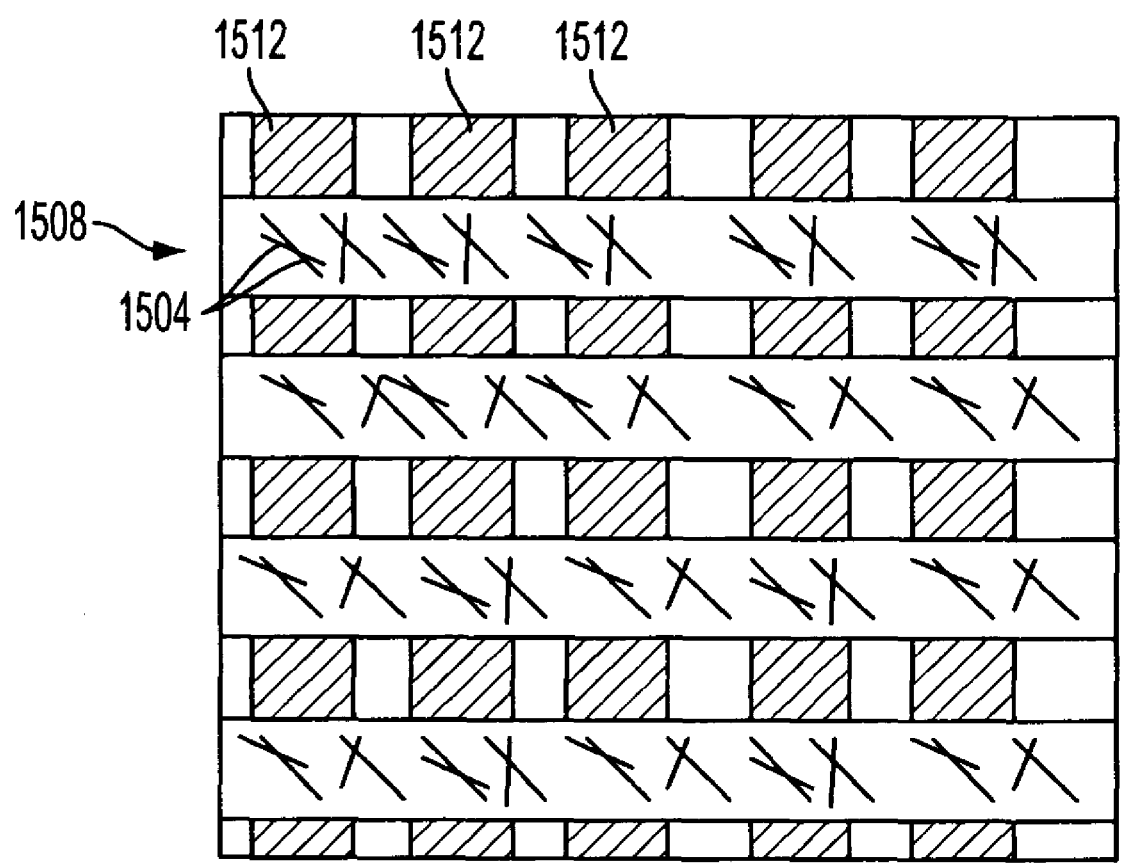
Figure 16:
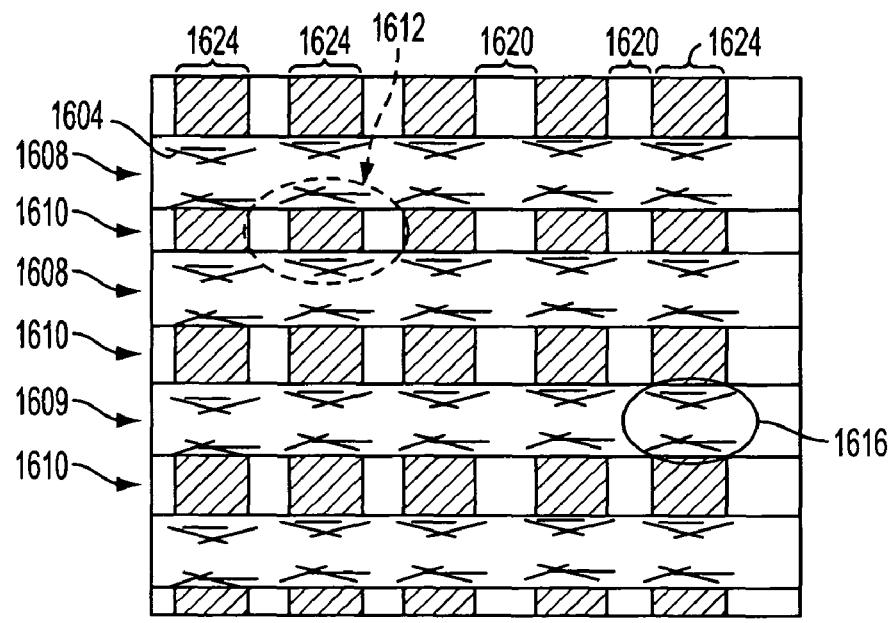
FIG. 16-18 show the process of forming an array of transistors using by printing droplets including semiconductor nanowires to form the transistor active region.
Figure 17:
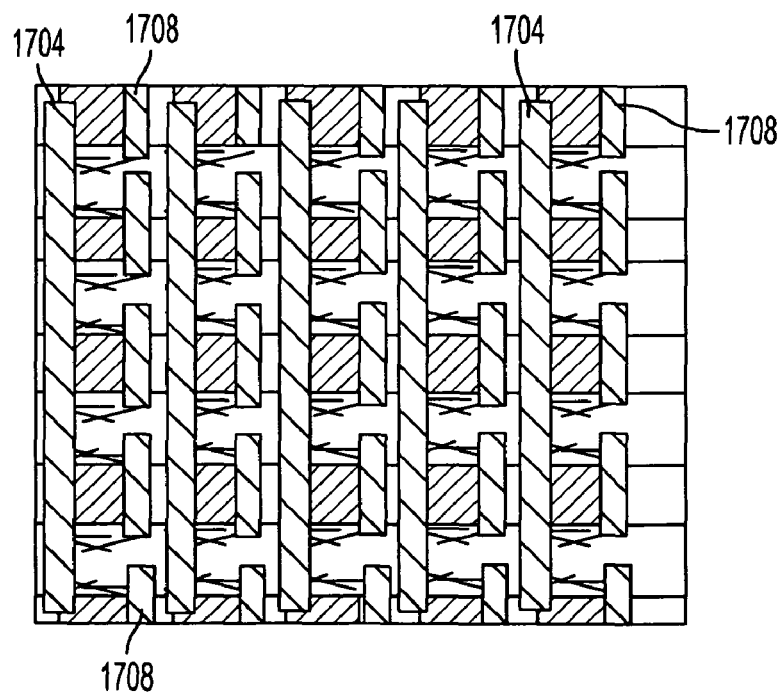

FIGS. 15-17 show fabricating transistor arrays using the described techniques. FIG. 15 shows one example of printing a nanowire 1504 array. A dielectric layer is patterned such that a hydrophilic, that is wettable by the printing fluid, or a depressed region 1508 runs approximately perpendicular to gate lines 1512. The adjacent regions to region 1508 are less wettable by the printing fluid or are raised relative to region 1508. Droplets containing nanowires 1504 are deposited on region 1508 of the patterned layer. The hydrophobic region edge approximately defines a long side of a deposited droplet as shown in FIG. 16.

The hydrophillic region edge runs approximately perpendicular to the gate lines 1624. In FIG. 16, the nanowires 1604 align with the hydrophillic region 1609 edge and are thus also perpendicularly oriented with respect to the underlying array of gate lines 1624. "Edge deposition" droplets may be used. When edge deposition is used, the droplet 1616 is centered with respect to the hydrophilic stripe 1609 and aligned to the gate line 1624. During drying the nanowires deposit at the edge of the droplet 1616 near the border between hydrophilic region 1609 and the surrounding region 1610. The nanowires from a single droplet can subsequently be used to form a transistor or nanowires from nearby drops can be used together such as shown in region 1612.

FIG. 17 shows subsequent deposition of source lines 1704 and drain lines 1708 to form a transistor array. In one embodiment, the shortest distance between the source and drain lines is typically less than a nanowire length. When fabricating a display or sensor using the described technique, the linewidth of the printed nanowire solution approximates the pixel pitch. Thus the typical pixel pitch for such structures is between 100 and 500 microns.

From FIG. 17, it can also be seen that the nanowires should be positioned to avoid shorting a transistor source electrode to the drain electrode of an adjacent transistor. Thus the droplets containing the nanowires should be carefully positioned to avoid droplet centers at the areas between gate lines such as region 1620 that separates adjacent transistors.

Although various details have been provided in this description, including types of nanostructures, devices that can be made, various surface treatments and various printing techniques, the invention should not be limited to those details. Instead, the invention should be described by the claims, as originally presented and as they may be amended, and as they encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A structure for forming a transistor comprising:
    a dielectric substrate, the dielectric substrate having a first surface that includes a fluid accumulation region between an area for a source electrode and an area for a drain electrode, the fluid accumulation region being pre-patterned via changing surface energies or topologies; and,
    a droplet of fluid in the fluid accumulation region, the droplet including semiconductor nanowires suspended in a carrier fluid, the droplet elongated due to the pre-patterned fluid accumulation region such that upon evaporation of the carrier fluid, the nanowires are aligned to form the active region of the transistor between a source electrode and a drain electrode as the droplet reduces in size.

2. The structure of claim 1 further comprising: a metal source electrode in the area for a source electrode and a metal drain electrode in the area for a drain electrode.

3. The structure of claim 1 further comprising:
    a gate electrode, the gate electrode formed on a second surface, the second surface on an opposite side of the dielectric substrate then the first surface.

4. The structure of claim 1 wherein the fluid volume of the droplet is less than 1000 picoliters.

5. The structure of claim 1 wherein the distance from the area for the source electrode and the area for the drain electrode is less than the length of a nanowire in the droplet.

6. The structure of claim 1 wherein a border of the fluid accumulation region is defined by a border, the border of the fluid accumulation region being more hydrophobic than the surface within the fluid accumulation region.

7. The structure of claim 1 wherein the nanowires are aligned in a center area of the droplet.

8. The structure of claim 1 wherein a contact line of the droplet moves inward, pushing the nanowires toward droplet center as the droplet evaporates.

9. The structure of claim 1 wherein the fluid wherein the fluid includes a solvent that exhibits a small contact angle hysteresis.

10. The structure of claim 1 wherein the fluid has two solvents with different vapor pressures and surface tensions.

11. The structure of claim 1 wherein the nanowires are aligned at perimeter of the droplet.

12. The structure of claim 1 wherein a contact line of the droplet stays approximately fixed, keeping the nanowires near perimeter of the droplet as the droplet evaporates.

13. The structure of claim 1 wherein the fluid includes a solvent that exhibits a large contact angle hysteresis.

14. The structure of claim 1 wherein the fluid includes a solvent that exhibits a contact angle hysteresis exceeding 10 degrees.

* * * * *

UNITED STATES PATENT AND TRADEMARK OFFICE
CERTIFICATE OF CORRECTION

PATENT NO.        : 7,838,933 B2
APPLICATION NO.   : 11/644055
DATED             : November 23, 2010
INVENTOR(S)       : Michael L. Chabinyc et al.

It is certified that error appears in the above-identified patent and that said Letters Patent is hereby corrected as shown below:

Front Page, please insert Assignee information:

--Assignee: Palo Alto Research Center Incorporated, Palo Alto, CA (US)--

Signed and Sealed this
Twenty-eighth Day of December, 2010

David J. Kappos
*Director of the United States Patent and Trademark Office*